(12) United States Patent
Jun

(10) Patent No.: US 7,773,954 B2
(45) Date of Patent: Aug. 10, 2010

(54) DEVICE AND METHOD FOR SYNTHESIZING TRANSMISSION FREQUENCY IN WIRELESS TERMINAL

(75) Inventor: In-Tae Jun, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 560 days.

(21) Appl. No.: 11/836,399

(22) Filed: Aug. 9, 2007

(65) Prior Publication Data

US 2008/0194213 A1 Aug. 14, 2008

(30) Foreign Application Priority Data

Feb. 12, 2007 (KR) .................. 10-2007-0014343

(51) Int. Cl.
  *H04B 1/40* (2006.01)
  *H04K 3/00* (2006.01)
(52) U.S. Cl. .................. 455/76; 455/119; 455/260
(58) Field of Classification Search ............ 455/75–76, 455/113, 119, 260, 265; 375/294
  See application file for complete search history.

(56) References Cited

U.S. PATENT DOCUMENTS 7,535,311 B2 * 5/2009 Nergis .................. 332/127

2004/0048590 A1 * 3/2004 Hammes et al. .......... 455/130

FOREIGN PATENT DOCUMENTS

| KR | 10-2003-0075438 A | 9/2003 |
| KR | 10-2006-0062153 A | 6/2006 |
| KR | 10-2006-0092002 A | 8/2006 |

* cited by examiner

*Primary Examiner*—Lee Nguyen
(74) *Attorney, Agent, or Firm*—Jefferson IP Law, LLP

(57) ABSTRACT

A device and method for synthesizing a transmission frequency (a Tx frequency) in a wireless terminal are provided, which are designed for stably operating a Phase Locked Loop (PLL) in order to synthesize a Tx frequency for a certain channel. The device includes a Radio Frequency (RF) transceiver for operating a Phase Locked Loop (PLL) in order to synthesize the Tx frequency when the wireless terminal requires the Tx frequency, and for transmitting the Tx frequency when the PLL is stabilized, a first signal generator for providing the RF transceiver with a first signal until the PLL is stabilized, a second signal generator for providing the RF transceiver with a second signal in a duration, for which the first signal is not provided, until the PLL is stabilized, and a controller for controlling the first signal generator to provide the RF transceiver with the first signal until the PLL is stabilized, and for controlling the second signal generator to provide the RF transceiver with the second signal in the duration for which the first signal is not provided.

10 Claims, 3 Drawing Sheets

DEVICE AND METHOD FOR SYNTHESIZING TRANSMISSION FREQUENCY IN WIRELESS TERMINAL

PRIORITY

This application claims the benefit under 35 U.S.C. §119 (a) of a Korean patent application filed in the Korean Industrial Property Office on Feb. 12, 2007 and assigned Serial No. 2007-14343, the entire disclosure of which is hereby incorporated by reference.

BACKGROUND OF THE INVENTION

1. Field of the Invention

The present invention relates to a device and method for synthesizing a transmission frequency (a Tx frequency) in a wireless terminal. More particularly, the present invention relates to a device and method for synthesizing a Tx frequency in a wireless terminal, which is designed for stably operating a Phase Locked Loop (PLL) in order to synthesize a Tx frequency for a certain channel.

2. Description of the Related Art

In a Global System for Mobile communication (GSM) wireless terminal circuit, a Radio Frequency (RF) transceiver operates a PLL system so as to synthesize a Tx frequency for a certain channel. It always takes time to stabilize the PLL system and generate a first transmission burst (a Tx burst), that is, a Tx Ramp-up period is required, and a base band unit usually provides the RF transceiver with an IQ dummy signal so as to ensure the time.

Usually, a fixed output duration of an IQ dummy signal at a base band unit and a fixed synthesizing duration of a Tx frequency at an RF transceiver are assigned according to each manufacturer.

However, when the wireless terminal requires a Tx frequency, and the base band unit cannot provide the RF transceiver with an IQ dummy signal for a sufficient time, the RF transceiver cannot properly synthesize a frequency, and thus cannot stably carry a transmission burst for a required certain channel. In this case, there will be some failures in planned interface design between a base band unit and an RF transceiver, and thus a base band chipset or an RF chipset intended for use may be useless.

SUMMARY OF THE INVENTION

An aspect of the present invention is to address the above-mentioned problems and/or disadvantages and to provide at least the advantages described below. Accordingly, an aspect of the present invention is to provide a device and method for synthesizing a transmission frequency (a Tx frequency) in a wireless terminal, which is designed for stably operating a Phase Locked Loop (PLL) in order to synthesize a Tx frequency for a certain channel in a wireless terminal.

Another aspect of the present invention is to provide a device and method for synthesizing a Tx frequency in a wireless terminal, which is designed for stably generating a transmission burst for a certain channel through a stable operation of a PLL for synthesizing a Tx frequency.

In accordance with an aspect of the present invention, a device for synthesizing a Tx frequency in a wireless terminal is provided. The device includes a Radio Frequency (RF) transceiver for operating a PLL in order to synthesize the Tx frequency when the wireless terminal requires the Tx frequency and for transmitting the Tx frequency when the PLL is stabilized, a first signal generator for providing the RF transceiver with a first signal until the PLL is stabilized, a second signal generator for providing the RF transceiver with a second signal in a duration, for which the first signal is not provided, until the PLL is stabilized, and a controller for controlling the first signal generator to provide the RF transceiver with the first signal until the PLL is stabilized and controlling the second signal generator to provide the RF transceiver with the second signal in the duration for which the first signal is not provided.

In accordance with another aspect of the present invention, a method of synthesizing a Tx frequency in a wireless terminal is provided. The method includes operating a PLL in order to synthesize a Tx frequency when a wireless terminal requires a Tx frequency, providing a first signal until a PLL is stabilized, providing a second signal in a duration, for which the first signal is not provided, until the PLL is stabilized, and starting to transmit a Tx frequency when the PLL is stabilized.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

Throughout the drawings, it should be noted that like reference numbers are used to depict the same or similar elements, features and structures.

DETAILED DESCRIPTION OF EXEMPLARY EMBODIMENTS

The following description with reference to the accompanying drawings is provided to assist in a comprehensive understanding of the exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Further, detailed descriptions of known functions and configurations incorporated herein will be omitted for clarity and conciseness.

Figure 1:
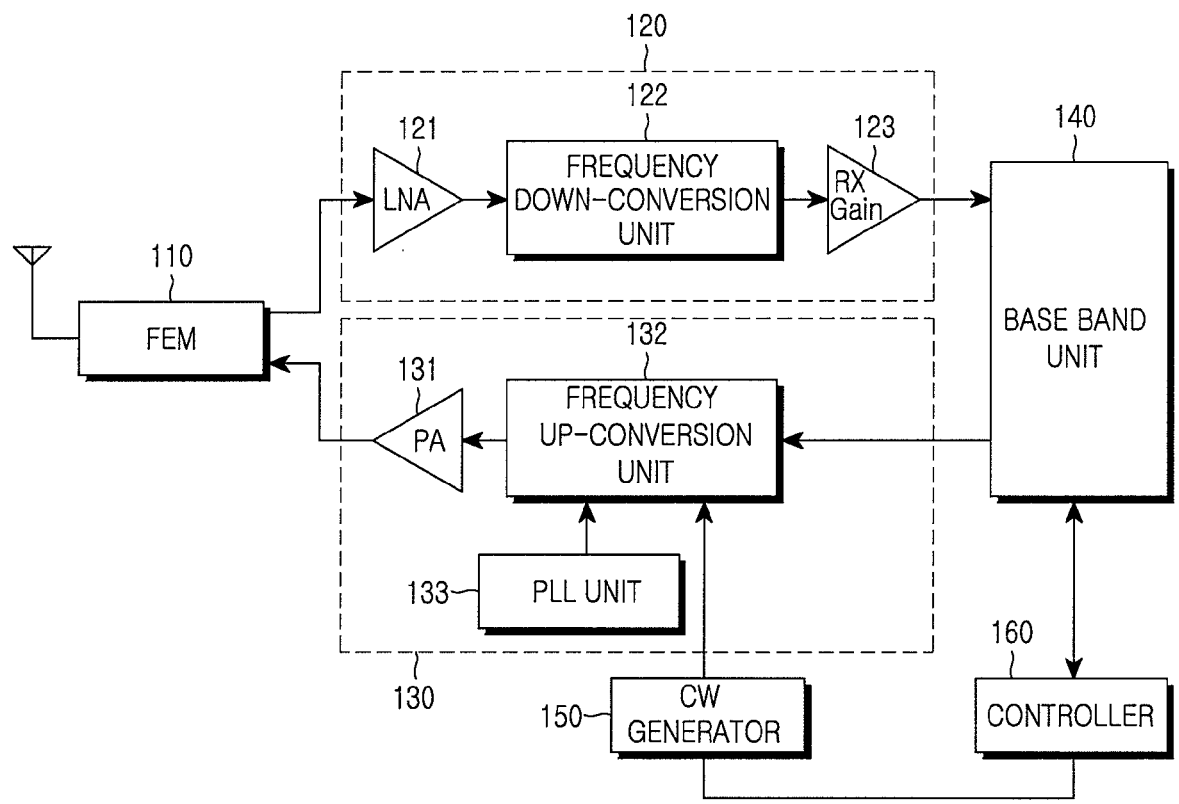
FIG. 1 is a block diagram illustrating a structure of a wireless terminal according to an exemplary embodiment of the present invention.

FIG. 1 is a block diagram illustrating a structure of a wireless terminal according to an exemplary embodiment of the present invention.

Referring to FIG. 1, at a Front End Module (FEM) 110, a sending end and a receiving end are diverged by an antenna of the wireless terminal. The FEM 110 transmits a receiving frequency received from the antenna to a Radio Frequency (RF) receiver 120 via the receiving end, and transmits a transmission frequency (a Tx frequency) received from an RF transmitter 130 to the antenna via the sending end.

An RF transceiver includes the RF receiver 120 and the RF transmitter 130.

The RF receiver 120 includes a Low Noise Amplifier (LNA) 121, a frequency down-conversion unit 122 and an amplifier 123.

The LNA 121 amplifies a signal received from the FEM 110 with low noise, and the frequency down-conversion unit 122 down-converts a frequency of the signal which is amplified at the LNA 121. According to a preset RX gain, the amplifier 123 amplifies a voltage of the signal of the frequency which is down-converted at the frequency down-conversion unit 122, and then sends the amplified signal to the base band unit 140.

The RF transmitter 130 includes a frequency up-conversion unit 132, a Phase Locked Loop (PLL) unit 133, and a Power Amplifier (PA) 131.

The frequency up-conversion unit 132 up-converts a frequency of a transmission signal. At this time, the PLL unit 133 maintains the signal sent to the frequency up-conversion unit 132 for a certain phase. Also, when the wireless terminal requires a Tx frequency according to an exemplary embodiment of the present invention, the PLL unit 133 operates a PLL system in order to synthesize a Tx frequency for a required certain channel. The PA 131 amplifies the signal of the frequency which is up-converted by the frequency up-conversion unit 132, and transmits the signal through the FEM 110 and an antenna.

The base band unit 140 encodes and modulates the transmission signal, and decodes and demodulates the receiving signal. Also, the base band unit 140 outputs a first signal, and thus provides the RF transmitter 130 with a meaningless first signal (an IQ Dummy signal) until a PLL is stabilized through the PLL system operation by the PLL unit 133.

A Carrier Wave (CW) generator 150 outputs a second signal, and thus provides the RF transmitter 130 with a second dummy signal in a duration, for which the first signal is not provided, until a PLL is stabilized through the PLL system operation. The CW generator 150 is composed separately or included in the RF transceiver.

A controller 160 controls general operations of a wireless terminal. Also, when the wireless terminal requires a Tx frequency according to an exemplary embodiment of the present invention, the controller 160 controls a PLL unit 133 to operate a PLL system until a PLL is stabilized.

Also, the controller 160 controls the base band unit 140 to provide the RF transmitter 130 with a first signal (an IQ dummy signal) until the PLL is stabilized according to an exemplary embodiment of the present invention.

Also, the controller 160 controls the CW generator 150 to provide the RF transmitter 130 with the second signal in the duration, for which the first dummy signal is not provided, until the PLL is stabilized according to an exemplary embodiment of the present invention.

Also, when the PLL is stabilized according to an exemplary embodiment of the present invention, the controller 160 controls the RF transmitter 130 to start to transmit a Tx frequency. Also, when the transmission of the Tx frequency is started according to an exemplary embodiment of the present invention, the controller 160 controls the CW generator 150 to deactivate the second signal.

Figure 2:
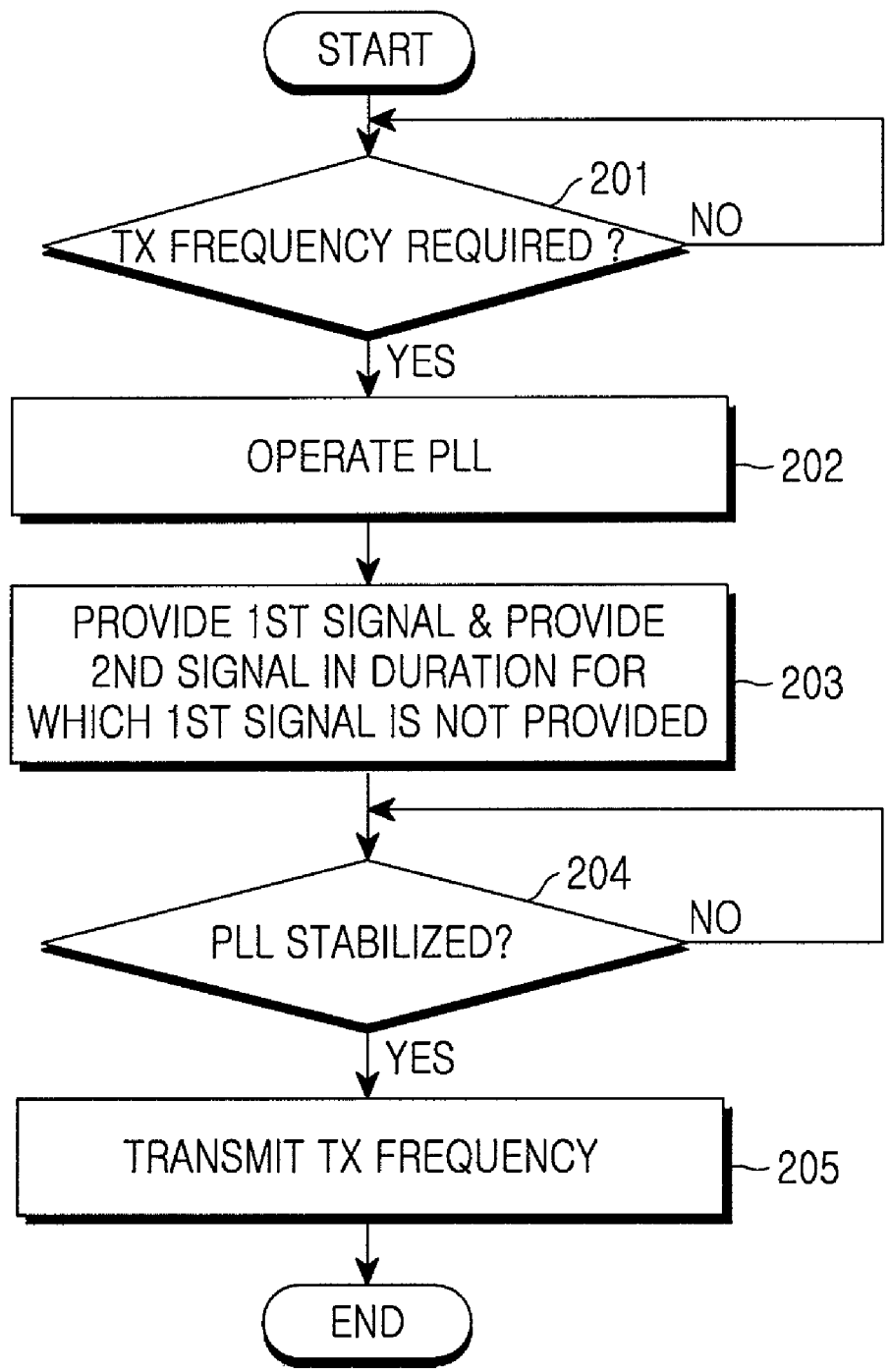
FIG. 2 is a flowchart illustrating a process for synthesizing a transmission frequency (a Tx frequency) in a wireless terminal according to an exemplary embodiment of the present invention.

FIG. 2 is a flow diagram illustrating a process for synthesizing a Tx frequency in a wireless terminal according to an exemplary embodiment of the present invention.

The following exemplary embodiment of the present invention is explained with reference to FIG. 1.

Referring to FIG. 2, when the wireless terminal requires a Tx frequency, the controller 160 detects the Tx frequency in step 201, and controls a PLL unit 133 of the RF transmitter 130 to operate a PLL system for synthesizing a Tx frequency for a required certain channel in step 202.

In step 203, the controller 160 controls the base band unit 140 to provide the RF transmitter 130 with a first signal (an IQ dummy signal) until a PLL is stabilized through the PLL system operation. Also, in a duration, for which the first signal is not provided, until the PLL is stabilized, the controller 160 controls the CW generator 150 to generate a second signal and to provide the RF transmitter 130 with the signal.

As the first signal is provided to the RF transmitter 130 until the PLL is stabilized, and the second dummy signal is provided to the RF transmitter 130 in the duration for which the first signal is not provided, the controller 160 determines whether the PLL is stabilized in step 204, and then, controls the RF transmitter 130 to start to transmit a Tx frequency in step 205. Also, when the RF transmitter 130 starts to transmit a Tx frequency, the controller 160 controls the CW generator 150 to deactivate the second signal.

Figure 3:
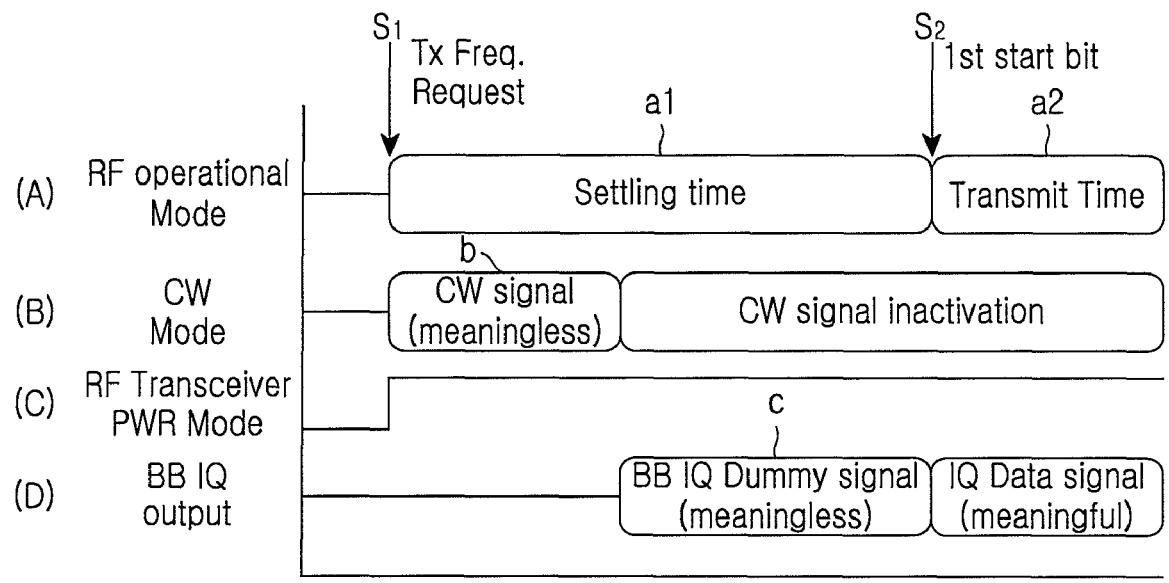
FIG. 3 illustrates a process for synthesizing a Tx frequency in a wireless terminal according to an exemplary embodiment of the present invention, and that is explained with reference to FIG. 2.

FIG. 3 illustrates a process for synthesizing a Tx frequency in a wireless terminal according to an exemplary embodiment of the present invention, and that is explained with reference to FIG. 2.

Referring to FIG. 3, FIG. 3(A) is an operating mode of an RF transmitter, FIG. 3(B) is an operating mode at which a CW generator 150 provides a second dummy signal, FIG. 3(C) is a power mode of an RF transceiver, and FIG. 3(D) is an operating mode at which a base band unit provides a first signal (an IQ dummy signal).

If a settling duration (a1) of a PLL at the RF transmitter is 120 Qbit (Quarter bit, that is, 1 Qbit=¼ bit≈0.92 μs), and an output duration (c) of a first signal at the base band unit 140 is 80 Qbit, when the wireless terminal requires a Tx frequency ($S_1$), the controller 160 controls the base band unit 140 to provide a first signal for 80 Qbit which is the output duration (c) of a first signal until a PLL is stabilized ($S_2$).

In order to complement the rest except the output duration (c) of a first signal provided from the base band unit 140, the controller 160 controls the CW generator 150 to generate an output duration (b) of a second signal for 40 Qbit and to supplement a stabilization duration of a PLL.

When the PLL is stabilized ($S_2$), the controller 160 controls the RF transmitter 130 to start to transmit the Tx frequency (a2).

As described above, exemplary embodiments of the present invention provide a device and method for synthesizing a Tx frequency in a wireless terminal, which is designed for stably operating a PLL in order to synthesize a Tx frequency in a wireless terminal. As a result, it is possible to prevent a PLL from wrongly operating at an RF transceiver, and to stably provide a Tx frequency for a required channel.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A device for synthesizing a transmission frequency (a Tx frequency) in a wireless terminal, the device comprising:
   a Radio Frequency (RF) transceiver for operating a Phase Locked Loop (PLL) in order to synthesize the Tx frequency when the wireless terminal requires the Tx frequency, and transmitting the Tx frequency when the PLL is stabilized;
   a first signal generator for providing the RF transceiver with a first signal until the PLL is stabilized;

a second signal generator for providing the RF transceiver with a second signal in a duration, for which the first signal is not provided, until the PLL is stabilized; and a controller for controlling the first signal generator to provide the RF transceiver with the first signal until the PLL is stabilized, and controlling the second signal generator to provide the RF transceiver with the second signal in the duration for which the first signal is not provided.

2. The device as claimed in claim 1, wherein the RF transceiver contains a PLL unit which operates the PLL in order to synthesize the Tx frequency.

3. The device as claimed in claim 1, wherein the first signal generator comprises a base band unit, and the first signal comprises an IQ dummy signal.

4. The device as claimed in claim 1, wherein the second signal generator comprises a carrier wave generator, and the second signal comprises a meaningless carrier wave signal.

5. The device as claimed in claim 1, wherein when the PLL is stabilized, the controller controls the RF transceiver to start to transmit the Tx frequency.

6. The device as claimed in claim 1, wherein when the RF transceiver starts to transmit the Tx frequency, the controller controls the second signal generator to deactivate the second signal.

7. The device as claimed in claim 1, wherein the second signal generator is included in the RF transceiver.

8. A method of synthesizing a Tx frequency in a wireless terminal, the method comprising the steps of:

operating a PLL in order to synthesize the Tx frequency when the wireless terminal requires the Tx frequency;

providing a first signal until the PLL is stabilized;

providing a second signal in a duration, for which the first signal is not provided, until the PLL is stabilized; and starting to transmit the Tx frequency when the PLL is stabilized.

9. The method as claimed in claim 8, wherein when transmission of the Tx frequency is started, the second signal is deactivated.

10. The method as claimed in claim 8, wherein the first signal comprises an IQ dummy signal, and the second signal comprises a meaningless carrier wave signal.

* * * * *